United States Patent [19]

Mullin et al.

[11] Patent Number: 5,601,652

[45] Date of Patent: Feb. 11, 1997

[54] APPARATUS FOR APPLYING CERAMIC COATINGS

[75] Inventors: Richard S. Mullin, Pomfret, Conn.; Leo A. Riendeau, Springfield, Mass.; Nicholas E. Ulion, Marlborough, Conn.

[73] Assignee: United Technologies Corporation, Hartford, Conn.

[21] Appl. No.: 389,216

[22] Filed: Aug. 3, 1989

[51] Int. Cl.$^6$ .................................................. C23C 16/00
[52] U.S. Cl. ............................ 118/723 EB; 118/723 FE; 118/723 FI
[58] Field of Search .................. 118/719, 723, 118/726, 723 EB, 723 CB, 723 FE, 723 FI; 427/38, 42, 255.2, 255.1; 219/121.15, 121.16; 313/231.31; 315/111.21

[56] References Cited

U.S. PATENT DOCUMENTS

| | | | |
|---|---|---|---|
| 3,331,716 | 7/1967 | Bloem et al. | 148/174 |
| 3,506,556 | 2/1968 | Gillery et al. | 204/192 |
| 3,974,059 | 8/1976 | Murayama | 118/726 |
| 4,050,408 | 9/1977 | Beucherie | 219/121.47 |
| 4,100,310 | 7/1978 | Ura et al. | 427/8 |
| 4,110,893 | 9/1978 | Elam et al. | 29/420.5 |
| 4,223,048 | 9/1980 | Engle, Jr. | 427/39 |
| 4,248,940 | 2/1981 | Goward et al. | 428/633 |
| 4,254,159 | 3/1981 | Pulker et al. | 427/38 |
| 4,287,224 | 9/1981 | Heimbach et al. | 427/42 |
| 4,321,311 | 3/1982 | Strangman | 428/623 |
| 4,404,236 | 9/1983 | Komatsu | 427/94 |
| 4,471,003 | 9/1984 | Cann | 427/38 |
| 4,513,026 | 4/1985 | Miyamoto et al. | 427/85 |
| 4,514,437 | 4/1985 | Nath | 427/39 |
| 4,551,221 | 11/1985 | Axenov et al. | 427/38 |
| 4,624,859 | 11/1986 | Akira et al. | 427/38 |
| 4,634,605 | 1/1987 | Wiesmann | 427/249 |
| 4,676,994 | 6/1987 | Demaray | 427/42 |
| 4,690,098 | 9/1987 | Mertens et al. | 118/727 |
| 4,777,062 | 10/1988 | Fuerstein | 427/42 |
| 4,811,690 | 3/1989 | Kawagoe et al. | 118/723 |
| 4,863,581 | 9/1989 | Inokuti et al. | 118/726 |

FOREIGN PATENT DOCUMENTS

| | | | |
|---|---|---|---|
| 141417 | 5/1985 | European Pat. Off. | 427/38 |
| 2129996 | 11/1972 | France | 427/38 |
| 55-104328 | 8/1980 | Japan | 427/42 |
| 60-145531 | 8/1985 | Japan | 118/726 |
| 60-165378 | 8/1985 | Japan | 118/726 |
| 62-249410 | 10/1987 | Japan | 118/723 |

OTHER PUBLICATIONS

D. Boone et al.: "Advanced Gas Turbine Coatings For Minimally Processed Coal Derived Liquid Fuels"; Fairbanks et al., editors: Dec. 1979.

R. E. Demaray, J. W. Fairbanks and D. H. Boone: "Physical Vapor Deposition of Ceramic Coatings for Gas Turbine Engine Components"; ASME 1982.

T. E. Strangman: "Thermal Barrier Coatings for Turbine Airfoils" Apr. 1984.

Battelle – Final Report Jan. 1985 "Combustion Zone Durability Program".

S. Shen: Technical Progress Report "Development of Improved Corrosion and Erosion Resistance Coatings for Gas Turbine Airfoils" – Reporting period: Oct. 1, 1979 to Apr. 30, 1980.

S. Shen: Final Progress Report "Development of Improved Corrosion and Erosion Resistance Coatings for Gas Turbine Airfoils" – Reporting period: Sep. 1, 1978 to Sep. 30, 1979.

E. Demaray: "Dedicated Electron Beam Reactive Physical Vapor Deposition (R.P.V.D.) Apparatus For The Production Of Ceramic Thermal Barrier Coatings" Project Final Report Dec. 1981.

Demaray et al., "Development of Electron Beam Physical Vapor Deposition of Ceramic Coatings"; Fairbanks et al. editors; May 1982.

*Primary Examiner*—Ngoclan Mai

[57] ABSTRACT

An apparatus for applying ceramic coatings using an electron beam-physical vapor deposition apparatus is described. The apparatus includes means for introducing the anionic constitutent of the ceramic into a coating chamber and means for confining the anionic constituent about the component to be coated during the coating process.

11 Claims, 2 Drawing Sheets

APPARATUS FOR APPLYING CERAMIC COATINGS

TECHNICAL FIELD

This invention pertains to apparatus for applying ceramic coatings to metal substrates. More specifically, it relates to an electron beam-physical vapor deposition apparatus particularly adapted for applying ceramic coatings to the surface of a metal component.

BACKGROUND

Ceramic coatings are described in U.S. Pat. Nos. 4,248,940 to Goward et al, 4,321,311 to Strangman and 4,676,994 to Demaray. Exemplary ceramics include zirconia stabilized by magnesia, ceria or yttria. Other types of ceramic coatings are also known, and include, for example, $Al_2O_3$ and MgO, TiN and $Si_3N_4$, and SiC. Ceramic coatings may be used in combination with a metallic coating layer, as discussed in the aforementioned patents, or they may be applied directly to the substrate surface.

The apparatus described by Goward applies ceramic coatings by plasma spray techniques, and the apparatus described by Strangman and Demaray apply ceramic coatings by electron beam-physical vapor deposition techniques.

While the thermal barrier coatings applied using the aforementioned apparatus and techniques have shown some utility in various industries, further improvements are sought for various applications. The present invention satisfies these needs.

SUMMARY OF THE INVENTION

This invention is an improved electron beam-physical vapor deposition apparatus for depositing ceramic coatings to a substrate. The apparatus includes a coating chamber, means for supporting a ceramic target within the chamber, and means for generating an electron beam and for impinging the beam onto the target. The apparatus also includes means for introducing the anionic constituent of the ceramic into the coating chamber and for confining such anionic constituent and evaporant produced by impingement of the electron beam on the ceramic target around the substrate during the coating process.

The term anionic constituent defines the gaseous species which corresponds to the anion formed when the coating target is evaporated by the electron beam. For example, when the coating target is zirconia, the anion formed is $O^{-2}$, and the anionic constituent is oxygen gas or a compound capable of providing oxygen atoms. Similarly, when the coating target is titanium nitride, the anion is $N^{-1}$, and the anionic constituent is nitrogen gas or a compound capable of providing nitrogen atoms.

The invention has particular use in the deposition of ceramic coatings of the type which undergo a reaction to a substoichiometric state when a ceramic target is evaporated in an environment characterized by a low partial pressure of the anionic constituent. An example of such a ceramic is zirconia, which reacts to form the substoichiometric species $ZrO_{2-x}$ during an electron beam-physical vapor deposition process in a low pressure chamber.

In one embodiment of the invention, anionic constituent is flowed into the coating chamber and towards the component to be coated through tubes which are in fluid communication with a source of the anionic constituent located outside of the coating chamber. Within the coating chamber is an enclosure which closely surrounds the component to be coated; the enclosure and the component therein are arranged over the coating target. The tubes flow anionic constituent directly into the enclosure which also includes at least one opening through which evaporant, produced by impingement of the electron beam on the ceramic target, is admitted. Evaporant condenses on the component surface; the enclosure confines anionic constituent to the vicinity of the component being coated, and results in the formation of high quality coatings.

The foregoing, and other objects, features and advantages of the present invention will become more apparent in light of the following detailed description of the preferred embodiments as illustrated in the accompanying drawing.

BEST MODE FOR CARRYING OUT THE INVENTION

Generally speaking, this invention relates to an electron beam-physical vapor deposition (EB-PVD) apparatus particularly adapted for applying ceramic coatings onto the surface of a component.

A key aspect of the invention relates to the use of an enclosure for confining anionic constituent of the ceramic to the space immediately surrounding the surface of the component being coated. As stated above, the term anionic constituent is meant to define the gaseous species which corresponds to the anion formed when the coating target is evaporated by the electron beam. The anionic constituent is introduced into the coating chamber in such a manner to minimize interference with and deterioration of the electron beam, and so that interference with the condensation of evaporant onto the component being coated is minimized.

Figure 1:
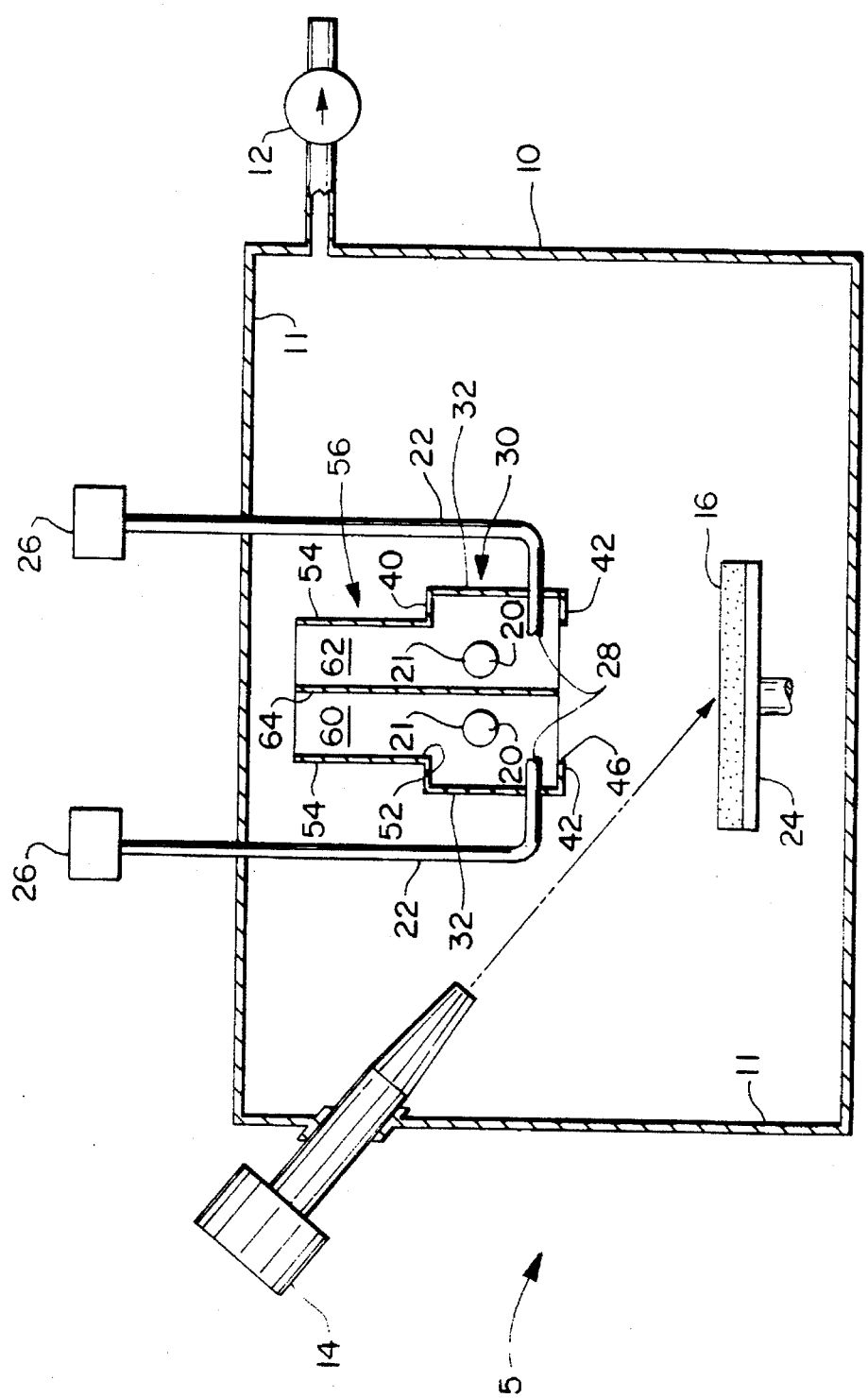
FIG. 1 is a simplified schematic drawing of an electron beam-physical vapor deposition apparatus according to this invention.

The above objectives are best met by an apparatus which is constructed in a manner shown by reference to the figures. In particular, FIG. 1 shows an EB-PVD coating apparatus 5 which includes a sealed coating chamber 10 defined by walls 11, and means 12 for evacuating the coating chamber 10. The apparatus 5 further includes an electron beam gun 14, a ceramic target 16, means 24 for supporting the target 16, and means for supporting one or more component 20 to be coated within the coating chamber 10. Such apparatus are all of the type conventional in the industry. FIG. 1 shows only one electron beam gun 14, ceramic target 16 and evacuating means 12 for purposes of clarity. It should be understood that more than one each of such components may be used.

The anionic constituent of the ceramic is admitted into the coating chamber 10 through one or more conduits or tubes 22 which extend from a source 26 of such constituent, preferably located outside of the coating chamber 10. Each tube 22 terminates at one or more tube outlet end 28. Each tube 22 is constructed and arranged to flow the anionic constituent through the outlet end 28, and towards the component 20 to be coated. As is seen in the Figure, each outlet end 28 is located between the component 20 and the coating target 16. Anionic constituent flows through each outlet end 28 towards the component 20 in a direction which is concurrent with (i.e., not countercurrent to) the direction that evaporant travels from the coating target 16 to the component 20.

Figure 2:
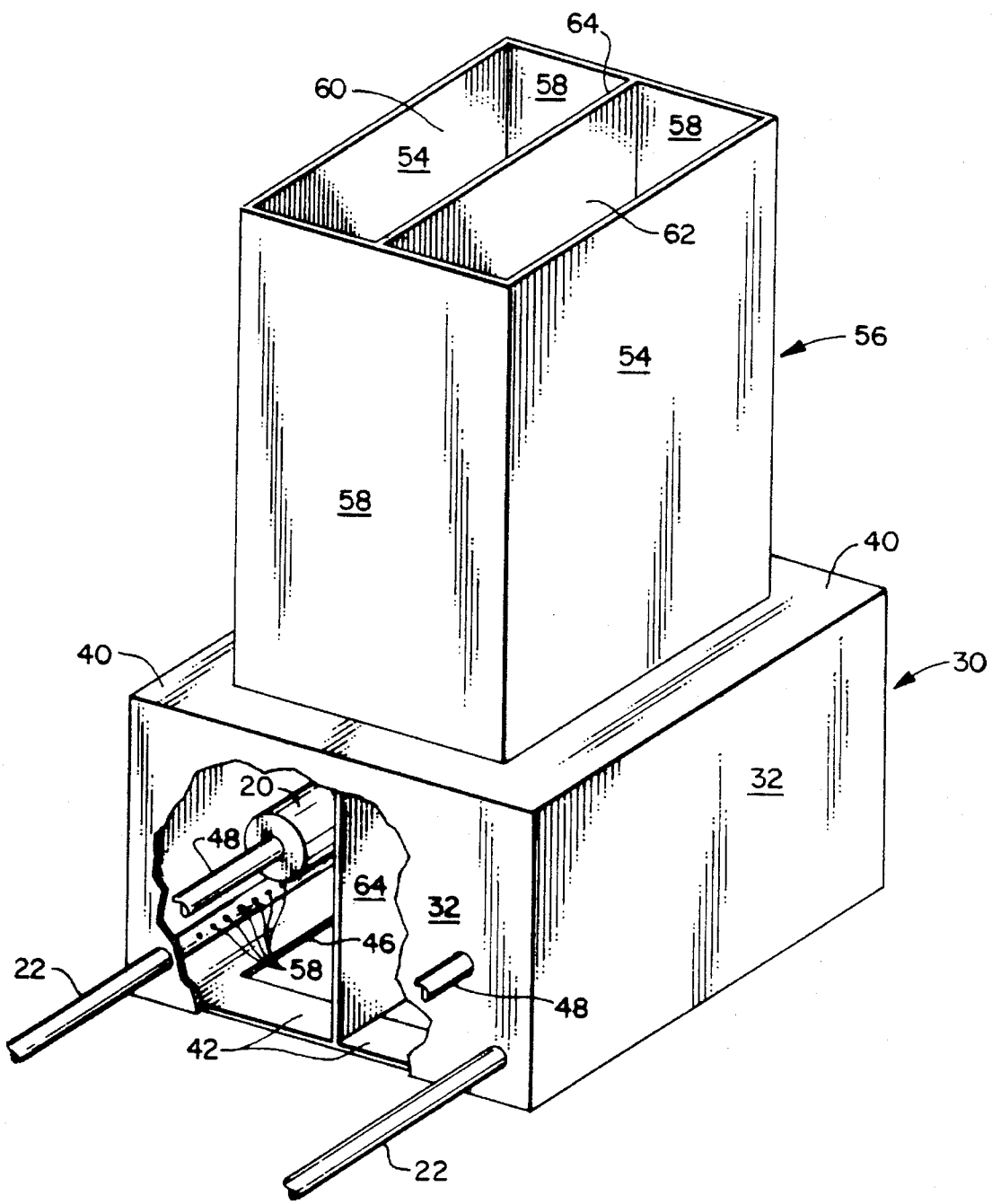
FIG. 2 is a perspective drawing, partly in cross section, showing the preferred reaction chamber of this invention.

As is also shown in FIG. 2, the tubes 22 flow the anionic constituent directly into an enclosure 30 (hereinafter referred to as a reaction chamber) which is suspended over the coating target 16 within the coating chamber 10. Each component 20 to be coated is suspended within the reaction chamber 30 in the manner discussed in more detail below. The reaction chamber 30 includes at least one wall 40 (hereinafter referred to as the top wall 40) which is closely spaced from the rearward surface 21 of the component 20 in approximately opposing relation to each tube outlet end 28. (The rearward surface 21 of the component 20 is the surface facing away from the coating target 16.) As is seen in the Figure, the top wall 40 is located between the coating chamber wall 11 and the rearward surface 21 of the component 20. Evaporant produced by impingement of the electron beam on the ceramic target 16 enters the reaction chamber 30 through an opening 46 in a bottom wall 42 which is spaced from the ceramic target 16.

The reaction chamber 30 also includes side walls 32 which, in combination with the top and bottom walls 40 and 42, define an enclosure which surrounds each component 20 to be coated. The dimensions of the reaction chamber 30 are smaller than the dimensions of the coating chamber 10. As a result, the reaction chamber 30 defines an internal volume which is smaller than the internal volume of the coating chamber 10. The top wall 40 has an opening 52 therein to allow some of the anionic constituent flowed into the reaction chamber 30 during the coating operation to exit the reaction chamber 30. The top and bottom openings 52 and 46, respectively, are substantially vertically aligned over the coating target 16.

The purpose of the reaction chamber 30 is, as described above, to confine the anionic constituent to the space immediately surrounding the component to be coated. The reaction chamber 30 creates a high partial pressure of anionic constituent around the component 20. When evaporant enters the reaction chamber 30 and collides with the component surface, it condenses upon the surface and forms the coating. And when the anionic constituent collides with the condensate, it combines with the condensate in a chemical reaction which fulfills any anionic deficiency in the coating, thereby forming a stoichiometric (or near stoichiometric) coating.

The reaction chamber 30 increases the likelihood that anionic constituent will collide with the condensate. Generally speaking, anionic constituent within the chamber rebounds from one wall of the reaction chamber 30 to another, until it either collides with and reacts with the condensate, or exits the reaction chamber 30 through its openings. The reaction chamber 30 therefore increases the residence time of the anionic constituent around the component 20.

The primary function of the opening 52 in the reaction chamber 30 is to vent anionic constituent from the reaction chamber 30, and thereby minimize interference of such constituent with the condensation of evaporant onto the component surface. The opening 52 directs excess anionic constituent from the reaction chamber 30 in a direction which does not intersect or interfere with the electron beam as it impinges upon the coating target 16. The preferred construction of the opening 52 is shown in FIG. 2; walls 54 which extend in a direction away from the coating target 16 are adjacent to the opening 52 and define a chimney-like structure 56.

Means 48 for securing the component to be coated within the reaction chamber 30 are preferably constructed to allow rotation and/or translation of the component about a longitudinal axis or any other axis. Movement (for example, rotation, translation or tilting) of the component 20 within the reaction chamber 30 during the coating operation promotes the formation of a coating having uniform thickness over the entire component surface.

Tubes 22 for admitting the anionic constituent into the reaction chamber 30 during the coating cycle pass through the reaction chamber wall 32 and are arranged to direct a flow of the anionic constituent towards each component 20 during the coating cycle. Preferably, the tubes 22 are arranged to flow the anionic constituent directly against the component surface. Most preferably, each tube 22 has a plurality of small diameter, closely spaced apertures 58 which flow the anionic constituent towards the component surface at an angle of about 45° to the horizontal. The tubes are oriented at an angle such that the apertures are at least partially shielded from evaporant which enters the reaction chamber 30. This configuration precludes evaporant from condensing in and significantly closing the apertures 52.

If more than one component is to be coated within the reaction chamber 30, the chamber is preferably divided into individual compartments 60 and 62 within which each component to be coated is secured. The compartments 60 and 62 are defined by a divider wall 64 which extends along the length of the reaction chamber 30 between walls 56 approximately parallel to walls 54. The divider 58 increases the amount of surface against which anionic constituent can rebound within the reaction chamber 30.

The reaction chamber 30 should be constructed such that the internal chamber dimensions are only slightly larger than the dimension of the component (or components) being coated. Such a construction confines the anionic constituent to the region immediately surrounding the components.

A reaction chamber of the type described above was constructed and shown to be useful in applying a columnar grain yttria stabilized zirconia coating to the surface of a nickel base alloy component. The chamber and tubes were constructed from an austenitic stainless steel alloy. The tubes had 0.75 mm diameter apertures spaced about 6.5 mm apart along a length of about 10 cm within the chamber. The apertures were oriented at an angle of about 45° to the horizontal, towards the centerline of each specimen to be coated, as shown in the Figure. The length of the chamber was about 25 cm, the width about 25 cm, and the height about 12 cm. The chimney 56 extended about 7.5 cm above the top face of the chamber, and was approximately centered over the top face, as is shown. The top and bottom openings were vertically aligned over the coating target. The component was situated about halfway between the top and bottom walls; the tubes entered the chamber at approximately the same level as the bottom wall.

While the invention has been shown and described with respect to a detailed embodiment, it will be understood by those skilled in the art that various changes in form and detail may be made without departing from the spirit and scope of what is claimed. For example, it may be efficient to place more than two tubes for admitting anionic constituents within the reaction chamber or at other locations than those shown in the Figures. Other changes are contemplated which do not depart from a device which confines the anionic constituent to a localized space surrounding the component to be coated.

We claim:

1. In an electron beam physical vapor deposition apparatus for applying a coating to the surface of a component, said apparatus comprising a coating chamber defining a first volume, means for supporting a ceramic target within said coating chamber, means for evacuating said coating chamber, and means for evaporating said target by impinging an electron beam onto said target within said coating chamber, the improvement which comprises an enclosure within said coating chamber, said enclosure chamber defining a second volume less than said first volume and including means for securing the component to be coated therewithin and over the ceramic target, said enclosure including an opening adjacent to the target for admitting into said enclosure evaporant produced by impingement of said electron beam upon said coating target, means for admitting anionic constituent of the ceramic into said enclosure, and means for venting such anionic constituent from said enclosure.

2. The apparatus of claim 1, wherein said means for admitting anionic constituent are in fluid communication with a source of such constituent located outside of said first chamber.

3. The apparatus of claim 2, wherein said securing means includes means for rotating the component about its axis.

4. The apparatus of claim 1, wherein said means for admitting anionic constituent into said enclosure has a plurality of outlet ends each located within the enclosure and intermediate said coating target and the component, and said ends are oriented at an angle to the horizontal, towards the centerline of the component.

5. Apparatus for applying a ceramic coating to the surface of a component comprising a coating chamber; means for evacuating said chamber; means for supporting a ceramic target within said chamber; means for generating an electron beam and for impinging the beam onto the target to produce evaporant of the target; an enclosure within said chamber comprising means for suspending the component within said enclosure and over the target, an opening adjacent to the target for admitting evaporant into said enclosure, means for admitting the anionic constituent of the ceramic into said enclosure and for venting such constituent from said enclosure, wherein the enclosure is slightly larger than the component therewithin, and is constructed and arranged to create a high partial pressure of anionic constituent around the component and to confine the anionic constituent and the evaporant around the component.

6. The apparatus of claim 5, wherein said means for suspending the component within said enclosure includes means for rotating the component about an axis.

7. The apparatus of claim 6, wherein said means for suspending the component includes means for translating the component about an axis.

8. The apparatus of claim 7, wherein said means for admitting anionic constituent has a plurality of outlet ends.

9. The apparatus of claim 8, wherein said outlet ends are closely spaced apertures oriented at an angle of about 45° to the horizontal and towards the centerline of the component.

10. The apparatus of claim 9, wherein said apertures are arranged to flow anionic constituent into said enclosure in a direction substantially concurrent with the flow of evaporant into said enclosure.

11. The apparatus of claim 5, wherein said means for venting are constructed and arranged to direct anionic constituent from said enclosure in a direction which does not intersect or interfere with the electron beam generated by said beam means.

* * * * *